United States Patent
Lanoiselee et al.

(10) Patent No.: US 9,001,900 B2
(45) Date of Patent: Apr. 7, 2015

(54) WEIGHTING FILTER, AND CORRESPONDING METHODS AND DEVICES FOR TRANSMITTING AND RECEIVING AN ANALOG SIGNAL AND COMPUTER PROGRAM

(75) Inventors: Marc Lanoiselee, La Chapelle des Fougeretz (FR); Pierre Siohan, Rennes (FR)

(73) Assignee: Orange, Paris (FR)

( * ) Notice: Subject to any disclaimer, the term of this patent is extended or adjusted under 35 U.S.C. 154(b) by 0 days.

(21) Appl. No.: 13/981,738

(22) PCT Filed: Jan. 25, 2012

(86) PCT No.: PCT/FR2012/050162
§ 371 (c)(1),
(2), (4) Date: Oct. 14, 2013

(87) PCT Pub. No.: WO2012/101382
PCT Pub. Date: Aug. 2, 2012

(65) Prior Publication Data
US 2014/0036971 A1 Feb. 6, 2014

(30) Foreign Application Priority Data
Jan. 25, 2011 (FR) ...................................... 11 50575

(51) Int. Cl.
*H04L 27/00* (2006.01)
*H03H 11/12* (2006.01)
*H04B 3/54* (2006.01)

(52) U.S. Cl.
CPC ......... *H04L 27/0002* (2013.01); *H03H 11/126* (2013.01); *H04B 3/54* (2013.01); *H04B 2203/5491* (2013.01)

(58) Field of Classification Search
CPC . H04L 27/0002; H04L 5/0091; H04L 5/0092; H04L 1/0001; H04W 52/367; H04B 1/0035
USPC ........................... 375/229, 257, 219; 370/329
See application file for complete search history.

(56) References Cited

U.S. PATENT DOCUMENTS

| | | | | |
|---|---|---|---|---|
| 3,760,276 A | * | 9/1973 | Shenier | 375/286 |
| 2002/0070770 A1 | * | 6/2002 | Ferianz | 327/108 |
| 2007/0049228 A1 | * | 3/2007 | Fujishima et al. | 455/253.2 |
| 2011/0080937 A1 | * | 4/2011 | Kim et al. | 375/219 |
| 2011/0103436 A1 | * | 5/2011 | Kim et al. | 375/219 |

(Continued)

OTHER PUBLICATIONS

International Search Report and Written Opinion dated Jul. 19, 2012 for corresponding International Patent Application No. PCT/FR2012/050162, filed Jan. 25, 2012.

(Continued)

*Primary Examiner* — Aristocratis Fotakis
(74) *Attorney, Agent, or Firm* — David D. Brush; Westman, Champlin & Koehler, P.A.

(57) ABSTRACT

A weighting filter is provided for use in a device for transmitting and/or receiving an analog signal. The device is capable of transmitting and/or receiving the analog signal in a predetermined frequency band consisting of two adjacent sub-bands, referred to as first and second sub-bands. The weighting filter includes: a first branch, which attenuates the analog signal; a second branch that filters the analog signal and has a bandwidth corresponding to the first sub-band or to the second sub-band; and a module that combines signals from the first and second branches.

12 Claims, 4 Drawing Sheets

(56) References Cited

U.S. PATENT DOCUMENTS

2011/0164514 A1* 7/2011 Afkhamie et al. ............ 370/252
2012/0128079 A1* 5/2012 Chuang ........................ 375/257
2012/0140804 A1* 6/2012 Corral .......................... 375/224
2014/0205026 A1* 7/2014 Smaini et al. ................. 375/257

OTHER PUBLICATIONS

French Search Report dated Oct. 12, 2011 for corresponding French Patent Application No. FR 1150575 filed Jan. 25, 2011.
Bohn, "Audio handbook", Jan. 1, 1976, pp. 1-5, XP007919549.
Ashley et al., "Active and Passive Filters as Loudspeaker Crossover Networks", Journal of the Audio Engineering Society, vol. 19, No. 6, Sep. 12, 1970, pp. 494-502, XP002660914, New York.
Lacanette, "High-Performance Audio Applications of the LM833", National Semiconductors application note, Aug. 1, 1985, XP002660915, Retrieved from the Internet: URL:http://www.national.com/an/AN/AN-346.pdf#page=1 [retrieved on Oct. 7, 2011].
Ashley et al., "Operational amplifier Implementations of Ideal Electronic Crossover Networks", 38th Convention of the Audio Engineering Society Journal of the Engineering Society, May 7, 1970, p. 19PP, XP002660916, New York, Retrieved from the Internet: URL:http://www.aes.org/tmpFiles/elib/20111007/1287.pdf [retrieved on Oct. 7, 2011].
Galli et al., "Recent Developments in the Standardization of Power Line Communications within the IEEE", IEEE Communications Magazine, Jul. 2008, pp. 64-71.
International Preliminary Report on Patentability and English Translation of the Written Opinion dated Jul. 30, 2013 for corresponding International Patent Application No. PCT/FR2012/050162, filed Jan. 25, 2012.

* cited by examiner

WEIGHTING FILTER, AND CORRESPONDING METHODS AND DEVICES FOR TRANSMITTING AND RECEIVING AN ANALOG SIGNAL AND COMPUTER PROGRAM

1. CROSS-REFERENCE TO RELATED APPLICATIONS

This Application is a Section 371 National Stage Application of International Application No. PCT/FR2012/050162, filed Jan. 25, 2012, which is incorporated by reference in its entirety and published as WO 2012/101382 on Aug. 2, 2012, not in English.

2. FIELD OF THE INVENTION

The field of the invention is that of analog transmissions in communications systems. The invention pertains especially to input analog interfaces of transmitters and/or receivers of a communications system known as "analog front-end transceivers" (AFEs) and more specifically to the filters used in such interfaces.

The invention can be applied especially in the field of power line communications (PLC), especially for transmitting signals in a broadened frequency band (of the order of 0 to 500 MHz).

3. PRIOR ART

3.1 Power Line Communications Transmission

The technology of power line communications as defined in the "HomePlug AV" specification or in the document "*Recent Developments in the Standardization of Power Line Communications within the IEEE*" by Stefano Galli and Oleg Logvinov, IEEE Communications Magazine, July 2008, enables the creation of a local area network working at high bit rates with an existing electrical network.

At present, this technology enables transmission at high bit rates in a frequency band of about 0 to 30 MHz in using OFDM type modulation.

In order to increase the transmission bit rates up to the order of one gigabyte per second, it is envisaged to broaden the frequency band up to values of the order of 500 MHz.

However, the broader this transmission band, the greater the risks of interference with other signals. Thus, in order to limit potential disturbances caused by radiation from the mains cables and affecting radio systems situated in the same frequency bands, a specific power profile has to be met.

Such a profile as illustrated in FIG. 1, provides that the maximum power density on the 0-30 MHz frequency band (also called low-frequency band or first band) is set at −50 dBm/Hz, and that the maximum power density on the 30-500 MHz frequency band (also called high-frequency band or second band) should be set at −80 dBm/Hz, namely 30 dB below the spectral power density permitted on the first band.

Another constraint for this broadening of bands is the presence of the FM band between 87.5 and 108 MHz, and of the VHF and UHF terrestrial television broadcasting services, the signals of which are at relatively high power levels and make these band portions hard to exploit for PLC signals.

This 30 dB difference in level in the power profile as well as the presence of the FM band and of the television broadcasting signals are major technical difficulties for setting up the analog part of a transceiver (AFE) of the communications system which must reconcile both a wide dynamic range and broad bandwidth.

3.2 Transceiver for Transmission on the 0-30 MHz Band

FIG. 2 is a more precise illustration of the schematic diagram of AFE system as used currently for transmitting PLC signals in the 0-30 MHz band.

Such an AFE system comprises:
- a digital processing module 21 at the physical layer level;
- a frequency/time conversion module (IFFT or Inverse Fast Fourier Transform module) or time/frequency conversion module (FFT) 22;
- a digital/analog conversion (DAC) module 23 for the digital signal;
- a module 24 for amplifying the analog signal feeding a emission filter 25;
- a module 26 for coupling to the mains network;
- a receive filter 27;
- a controlled-gain amplification (CGA) module 28 for the analog signal coming from the receive filter 27;
- an analog/digital conversion (ADC) module 29 for the analog signal.

More specifically, in transmission, the digital signal coming from the digital processing module 21 is converted from the frequency domain into the time domain in the frequency/time conversion module 22 and then converted into analog form by the digital/analog converter 23. The analog signal is then amplified 24 and filtered by the emission filter 25 in order to eliminate the undesirable components of the digital/analog conversion and then coupled 26 to the mains network.

Such a coupling module 26 also provides for the reception of the PLC signals.

Thus, in reception, the received signal is filtered by the receive filter 27 so as to preserve only the payload components of the spectrum of the signal, then calibrated in power by the controlled-gain amplification module 28 and then subjected to analog/digital conversion 29.

With this structure, the performance of the AFE system in terms of bandwidth and dynamic range relies essentially on the characteristics of the digital/analog and analog/digital converters used.

3.3 Transceiver for Transmission in the 0-500 MHz Band

However, if we consider transmission on a broadened band of the order of 0-500 MHz, it is presently possible to use only one AFE system which reconciles all the constraints laid down.

Indeed, if we take the low-frequency band (up to 30 MHz) the signal-to-noise ratio (SNR) is considered to be relatively good because of a high signal level and low attenuation of the channel. It is therefore desirable to use digital/analog converters and analog/digital converters having a high signal-to-noise ratio and therefore a high effective number of bits (ENOB). These characteristics make it possible to achieve very good transmission bit rates with constellations having a very large number of states, of the QAM 1024 or QAM 4096 quadrature amplitude modulation type for example.

By contrast, if the operation is situated in the high frequency band (between 30 and 500 MHz) these converters with high ENOB are no longer appropriate because they have very low sampling frequencies (of the order of 300-400 MHz). Furthermore, the 30 dB attenuation of the power profile relative to the low-frequency band as well as the weakening of the transmission channel makes it necessary to work with low signal-to-noise ratios. Thus, it is desirable to use other types of converters which have only few quantification bits but enable the sampling of very wide band signals with sampling frequencies of the order of one gigahertz.

Owing to these different constraints between low-frequency and high-frequency bands, the proposed techniques rely on a distinct exploitation of these two bands and on the implementation on two types of physical layers and AFE systems.

In other words, it is currently envisaged to duplicate the AFE system as illustrated in FIG. 3, such that each of the two bands has its own physical layer digital processing which must be distinct (at least in reception) owing to the conditions of analog processing, filtering, CGA and different samplings.

Thus, a first AFE system is associated with the low-frequency band B1. It comprises a physical layer digital processing module 211, a frequency/time conversion module or time/frequency conversion module 221, a digital/analog conversion module 231, an emission filter EF1 251, a receive filter RF1 271, a controlled-gain amplification module 281 and an analog/digital conversion module 291.

A second AFE system is associated with the high-frequency band B2. It comprises a physical layer digital processing module 212, a frequency/time or time/frequency conversion module 222, a digital/analog conversion module 232, an attenuation module 30, an emission filter EF2 252, a receive filter RF2 272, a controlled-gain amplification module 282 and an analog/digital conversion module 292.

These two AFE systems also have a digital processing module 31 at the MAC layer and a module 26 for coupling with the mains network common to both bands.

More specifically, for the first band B1, the sampling can be done at low frequency of the order of 80 MHz in order to use low-cost digital/analog converters 231 and analog/digital converters 291. However, the sampling of the second frequency band B2 is preferably of the order of 200 MHz at least.

With this configuration, the power profile of FIG. 1 is obtained by relative attenuation (30) of the transmission signal, after digital/analog conversion 232 of the high-frequency band B2, by 30 dB as compared with that of the first frequency band B1. In this case, the signal-to-noise ratio at output of the digital/analog converter 232 of the second band B2 can be kept after attenuation and can remain sufficient to envisage modulations with a large number of states on the second band B2.

However, this technique which consists in duplicating the AFE system has several drawbacks.

A first drawback of this technique is the complexity required to simultaneously transmit data on the first and second bands since each of the two bands requires its own AFE system and a physical layer digital processing operation that is entirely or to a great extent distinct.

Another drawback of this technique is its cost in terms of resources owing to the duplication of most of the modules.

Yet another drawback of this technique is the difficulty of making analog emission filters for the first frequency band and receive filters for the second frequency band which need to be highly selective.

Indeed, the emission filter EF1 251 should be capable of eliminating the first harmonic component from the response of the digital/analog converter 231 of the first frequency band. Now, this first frequency band is situated, after recombination of the two AFE systems, at 30 dB above the second band (because of the power profile illustrated in FIG. 1). The emission filter EF1 251 must therefore be highly frequency selective so that the second frequency band B2 is not disturbed by the digital/analog converter 231 of the first band B1.

Furthermore, the response of the receive filter RF2 272 before sampling of the second band B2 should have high selectivity and out-of-band rejection so that the portion of the first band B1 that enters the frequency band of the receive filter RF2 remains at a power level that is low as compared with that of the second band B2.

Thus, despite this duplication of the AFE system, certain conditions relating to the analog filtering remain difficult to comply with.

There is therefore a need for a novel filtering technique that makes it possible to overcome at least some of these drawbacks.

4. SUMMARY OF THE INVENTION

The invention proposes a novel weighting filter intended for use in a device for transmitting and/or receiving an analog signal, said device being capable of transmitting and/or receiving said analog signal in a predetermined frequency band formed by two adjacent sub-bands called first and second sub-bands.

According to the invention, such a weighting filter comprises:

a first branch comprising means for attenuating the analog signal;

a second branch comprising means for filtering the analog signal, said filtering means having a bandwidth corresponding to the first sub-band or else to the second sub-band;

means for combining the signals coming from the first and second branches.

Thus, the invention relies on a particular, generic filter structure which can be implemented in the analog parts of a transmitter and a receiver of an AFE communications system. In other words, the structure of such a filter is identical when transmitting and when receiving.

In particular, it can be noted that such a weighting filter is adapted for transmission by power line carrier in a broadened frequency band.

For example, the first sub-band is of the order of 0-30 MHz and the second sub-band is of the order of 30-87.5 MHz. The invention thus proposes to jointly process the low-frequency band (first sub-band) and the frequencies below 87.5 MHz of the high-frequency band.

A weighting filter of this kind, used when transmitting and/or receiving, makes it possible to comply with and/or receive the power spectral density profile illustrated in FIG. 1, according to which the maximum power of the second sub-band must be 30 dB below that of the first sub-band.

According to a first aspect of the invention, the means of attenuation comprise a resistance attenuator.

The first branch of the weighting filter therefore corresponds to an attenuated direct path.

In particular, such an attenuator is particularly simple to implement.

Furthermore, the choice of the values of resistances makes it possible to comply with the power spectral density profile illustrated in FIG. 1. In particular, the attenuation corresponds to the difference in power between the first and second sub-bands (30 dB for transmission by PLC), plus the loss related to the insertion of the weighting filter into the frequency band (for example 6 dB).

According to another characteristic, the filtering means comprise three filtering cells, two of which are "M" type cells, having a "constant K" type cell situated between them.

The filtering means of the second branch are thus easy to implement from known filtering cells.

These filtering cells can be used to obtain a high frequency-selective low-pass filter (for transmission) or high-pass filter (for reception).

According to yet another characteristic, the means for combining comprise a differential amplifier. The two branches of the weighting filter can therefore be recombined by means of a differential amplifier.

Such a differential amplifier is well suited to the processing of analog signals. Furthermore, this is an element well known and easy to implement.

The invention also pertains to a device for transmitting an analog signal in a predetermined frequency band formed by two adjacent sub-bands, called a first sub-band and a second sub-band comprising a weighting filter as defined here above.

This device could of course comprise the different characteristics of the weighting filter. Thus, the characteristics and advantages of this device are the same as those of the weighting filter.

Such a transmitting device corresponds for example to the input analog interface or analog front-end (AFE) unit of an apparatus of a communications network.

According to the invention, such a transmitting device comprises a structure that is simplified as compared with prior-art broadband AFE systems.

In particular, such a transmitting device removes the need for duplication of most of the elements of a classic AFE system to enable operation in a broadened band and to simplify the processing of the physical layer signal by using one and only one physical layer for the global 0-87 MHz band.

Finally, such a device makes it possible to generate a transmitting signal that complies with the power profile of FIG. 1.

In particular, such a transmitting device comprises:
a module for the digital processing of data to be sent, at the physical layer, delivering a digital signal;
a module for frequency-time conversion of the digital signal;
a module for digital-analog conversion of the digital signal in the time domain, delivering the analog signal;
a module for amplifying the analog signal, feeding the weighting filter;
a module for coupling the analog signal coming from the weighting filter with the mains network.

It can be noted that the implementation of the weighting filter of the invention, after digital/analog conversion, makes it possible to preserve a signal-to-digital/analog conversion noise ratio that is identical whatever the bandwidth considered (0-30 MHz or 30-87 MHz).

Furthermore, the power profile obtained on the two output sub-bands of the digital/analog conversion is uniform.

According to one particular embodiment, the filtering means of the weighting filter comprise three filtering cells, two of which are "M" type cells with a "constant K" type cell situated between them. The M cells each comprise three inductive components and one capacitive component, and the constant K cell comprises two inductive components and one capacitive component. Each of the inductive components of the constant K cell can be grouped together with an inductive component of one of the M cells. In other words, the association of these three filtering cells enables the grouping together, at the two interfaces, of two inductive components in only one component.

The filtering means of the weighting filter are thus built by using cells of a known type. As already indicated, these filtering cells are used to obtain a low-pass filter (when transmitting) or high-pass filter (in reception) without modifying the structure of the filtering means, in simply permutating the inductive and capacitive components.

The invention also pertains to a device for receiving an analog signal in a predetermined frequency band formed by two adjacent sub-bands called first and second sub-bands comprising a weighting filter as described here above.

This device could of course comprise the different characteristics of the weighting filter. Thus, the characteristics and advantages of this device are the same as those of the weighting filter.

A reception device of this kind corresponds for example to the input analog interface or analog front-end (AFE) unit of an apparatus of a communications network.

In particular, the use of a weighting filter with an identical structure when transmitting and receiving gives an efficient recombination of the signals. In other words, the cascading of the transmission device described here above and of the reception device makes it possible to render a uniform power profile.

In particular, such a reception device comprises:
a module for coupling to the mains network providing for the reception of the analog signal and feeding the weighting filter;
a controlled-gain amplification module for the analog signal coming from the weighting filter;
a module for analog/digital conversion of the amplified analog signal delivering a digital signal;
a module for the time-frequency conversion of the digital signal;
a module for digital processing of the digital signal in the frequency domain, at the physical layer, enabling the rebuilding of the data sent.

It can be noted that the implementation of the weighting filter according to the invention before analog/digital conversion makes it possible to preserve an identical signal-to-analog/digital conversion noise ratio whatever the sub-band considered (0-30 MHz or 30-87 MHz).

Furthermore, the power profile obtained on the two sub-bands at input of the analog/digital conversion module is uniform.

According to one particular embodiment, the filtering means of the weighting filter comprise three filtering cells, two of which are "M" type cells with a "constant K" type cell situated between them. The M cells each comprise three capacitive components and one inductive component, and the constant K cell comprises two capacitive components and one inductive component. Each of the capacitive components of the constant K cell can be grouped together with a capacitive component of one of the M cells. In other words, the association of these three filtering cells enables the grouping together, at the two interfaces, of two capacitive components in only one component.

In another embodiment, the invention pertains to a method for transmitting an analog signal in a predetermined frequency band formed by two adjacent sub-bands called first and second sub-bands.

According to the invention, such a method comprises a step for the weighting filtering of the analog signal, implementing a weighting filter as described here above.

Such a transmission method can be implemented by a transmission device as described here above. The advantages of this method are similar to those of the corresponding device and are not described again.

In yet another embodiment, the invention pertains to a method for receiving an analog signal in a predetermined frequency band formed by two adjacent sub-bands called first and second sub-bands.

According to the invention, a reception method of this kind comprises a step for filtering the weighting of the analog signal, implementing a weighting filter as described here above.

Such a method for receiving can be implemented by the reception device as described here above. The advantages of this method are similar to those of the corresponding device and are not described again.

Another aspect of the invention pertains to a computer program comprising instructions suited to implementing methods for transmitting and/or receiving presented here above when the program is executed by a processor. Such a program can use any programming language whatsoever. It can be downloaded from a communications network and/or recorded on a computer-readable medium.

5. LIST OF FIGURES

Other features and advantages of the invention shall appear more clearly from the following description of a particular embodiment given by way of a simple illustratory and non-exhaustive example and from the appended drawings, of which:

FIG. 1, presented in relation with the prior art, illustrates the power profile that must be complied with by signals sent in the 0-500 MHz frequency band;

FIGS. 2 and 3, also described with reference to the prior art, present the structure of a classic AFE system for transmission on the low-frequency band and the structure of an AFE system duplicated for transmission in a broadened band;

FIG. 4 illustrates the structure of a weighting filter according to the invention;

FIGS. 5A to 5C recall the characteristics of the "M" and "constant K" cells playing a part in the weighting filter of FIG. 4;

6. DESCRIPTION OF ONE EMBODIMENT OF THE INVENTION

6.1 General Principle

The general principle of the invention relies on a novel structure of frequency-selective filters called "weighting filters" which can be used in the analog part of a transmitter and/or a receiver.

This novel structure makes it possible especially to carry out communications on a broad frequency band formed by two adjacent sub-bands, for example a first sub-band of the order 0-30 MHz and a second sub-band of the order of 30-87.5 MHz while complying with a predetermined power profile.

Such weighting filters can be of a low-pass type in transmission, or high-pass type in reception. The structure of these weighting filters is identical in transmission and in reception and the emission filters differ from the receive filters only by the permutation of the inductive and capacitive components.

Figure 4:
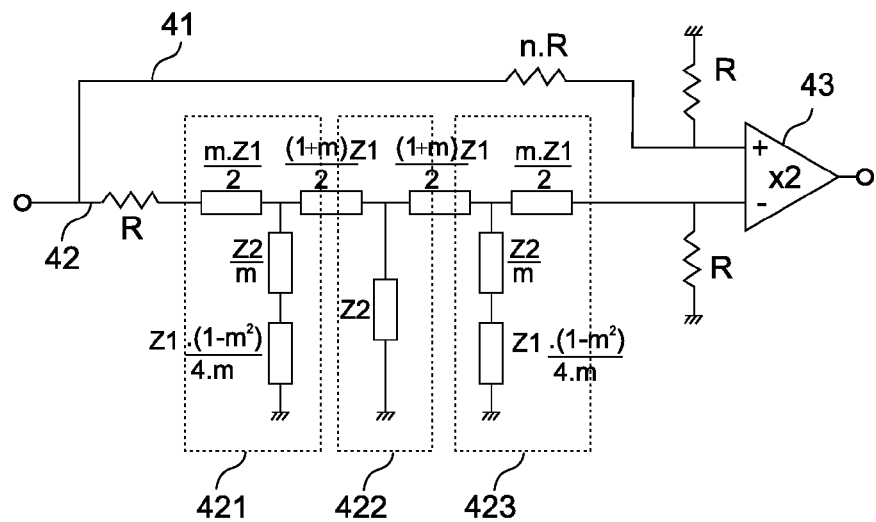

FIG. 4 provides a more precise illustration of the structure of a weighting filter according to the invention.

Such a weighting filter comprises two branches, called a first branch 41 and a second branch 42 and means 43 for combining signals coming from the first and second branches, taking for example the form of a differential amplifier.

More specifically, the first branch 41 comprises means for attenuating the analog signal, taking for example the form of a resistance attenuator. In a wholly conventional manner, the input signal is considered to come from a voltage generator of an op-amp (operational amplifier) type for example and is input into the weighting filter, and therefore the first branch 41. The resistance attenuator can then be simply constituted by two resistors mounted as a divider bridge as is implemented conventionally in electronics. According to FIG. 4, the value of the attenuation is then given by the relationship:

$$\text{attenuation (dB)} = 20 \times \log(R/(R + n \times R))$$

For n=62, the attenuation is then 36 dB.

The second branch 42 for its part comprises means for filtering the analog signal having a bandwidth corresponding to the first sub-band if the weighting filter is used in transmission or else to the second sub-band if the weighting filter is used in reception. In a wholly conventional way, the input signal is considered to come from a voltage generator, of an op-amp (operational amplifier) type for example and is input into the weighting filter and therefore the second branch 42. The means for filtering the weighting filter comprise three filtering cells 421 to 423, of which two "M" type cells with a "constant K" type cell situated between them. Conventionally, the M and constant K filtering cells must be source impedance matched to input and load impedance matched to output. Since a voltage generator is applied to input of the second branch 42, a first resistor R situated before the filtering cells makes it possible to dictate a source impedance. Similarly, at output of the second branch 42, a second resistor R makes it possible to dictate a load impedance before recombination of the two branches 41 and 42 by a differential amplifier. In this way, the loss related to the insertion of the weighting filter in the passband is 6 dB.

Figure 5A:
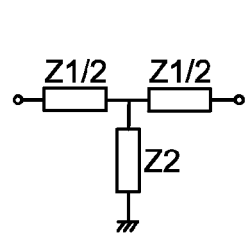
Figure 5B:
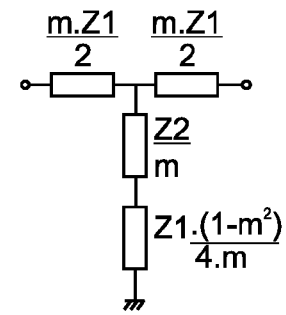
Figure 5C:
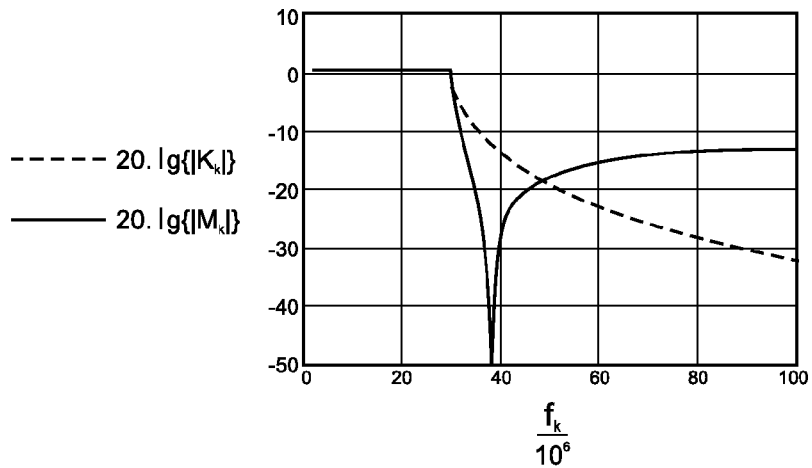

As a reminder, FIGS. 5A to 5C respectively illustrate the structure of a constant K cell, the structure of an M cell and the response curves of these two types of cell, for an example of a low-pass filter with a 30 MHz bandwidth, with $Z1=j.L.\omega$, $Z2=1/j.C.\omega$ et m=0.6.

It may be recalled that M cell is a cell derived from the constant K cell, improving the characteristics of the constant K cell. Its properties are mainly: a same bandwidth as the constant K cell, almost constant impedance in the bandwidth, transmission zero in the out-of-band improving the selectivity of the filter in the neighborhood of the cut-off frequency, partial distant out-of-band rejection.

On the basis of this M cell, the invention proposes a generic weighting filter, the complexity of which remains comparable with that of a classic low-pass filter or high-pass filter, and which makes it possible, depending on the type of components Z1 and Z2 (capacitive or inductive) to carry out a weighting in transmission or in reception.

More specifically, if the weighting filter is used in transmission, the M cells 421 and 423 of the second branch each comprise three inductive components (Z1) and one capacitive component (Z2), and the constant K cell 422 comprises two inductive components (11) and one capacitive component (Z2). As illustrated in FIG. 4, each of the inductive components of the constant K cell (Z1/2) can be grouped together with an inductive component of one of the M cells (mZ1/2), to form a single inductive component ((1+m)Z1/2).

If the weighting filter is used in reception, the M cells 421 and 423 of the second branch each comprise three capacitive components (Z1) and one inductive component (Z2) and the constant K cell 422 has two capacitive components (Z1) and one inductive component (Z2). Again, as shown in FIG. 4, each of the capacitive components of the constant K cell (Z1/2) can be grouped together with a capacitive component of one of the M cells (Z2/2) to form a single capacitive component ((1+m)Z1/2).

The weighting filter thus obtained then makes it possible:
when it is implemented in transmission: to apply a low-pass filter to a signal transmitted in a first frequency sub-band (through a second branch of the generating filter) or to attenuate the power of a signal transmitted in the second frequency sub-band (through the first branch of the weighting filter);
when it is implemented in reception: to apply a high-pass filter to a signal transmitted in the second frequency sub-band (through the second branch of the weighting filter) and to attenuate the power of a signal transmitted in the first frequency sub-band (through the first branch of the weighting filter).

6.2 Application to PLC Transmissions

Here below, we describe the application of the weighting filters according to the invention to broadened band PLC transmissions.

It may be recalled that the PLC transmissions are currently authorized in a frequency band of the order of 0-30 MHz and that it is planned to broaden this frequency band up to values of the order of 500 MHz in order to increase the transmission bit rates. As already indicated with reference to the prior art, one constraint for this band broadening is the presence of the FM band between 87.5 and 108 MHz.

The inventors have noted that the 30-87.5 MHz sub-band necessitates special processing. In particular, if it is attached to the low-frequency band (about 0-30 MHz), its processing lays down strong constraints of signal dynamic range and complexity of the transmission/reception system because of the 30 dB attenuation in the power profile 30 MHz onwards. If it is processed with the high-frequency band up to 500 MHz, it is under-exploited by low quantification, given that there are characteristics of weakening of the channel that are still favorable in this sub-band as compared with those of the higher frequency bands.

The invention thus proposes to jointly process the low-frequency band (also called the first sub-band) and the frequencies below 87.5 MHz of the high-frequency band (also called the second sub-band) in using the particular structure for the analog transmitting/receiving part of an apparatus of a network, relying on the implementing of a new weighting filter as described here above.

The solution proposed also makes it possible to simplify the processing of the physical layer signal by using one and the same physical layer for the total 0-87 MHz band.

Figure 1:
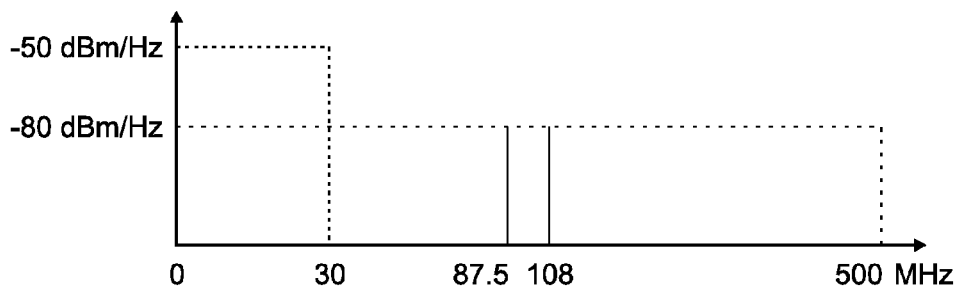

In other words, the invention simplifies the principle of PLC transmission in the 0-87 MHz band by implementing a same physical layer and a single AFE type system for the transmission of the first and second sub-bands while preserving a signal-to-digital/analog conversion and analog/digital conversion noises ratios that are identical for both sub-bands, and in complying with the power profile of FIG. 1.

To achieve this goal, the invention proposes an analog weighting filter solution that is of low complexity and can be easily implanted in the context of a hardware embodiment, of which the characteristics, especially the phase characteristics, are compatible with the transmission of an OFDM signal.

Figure 6:
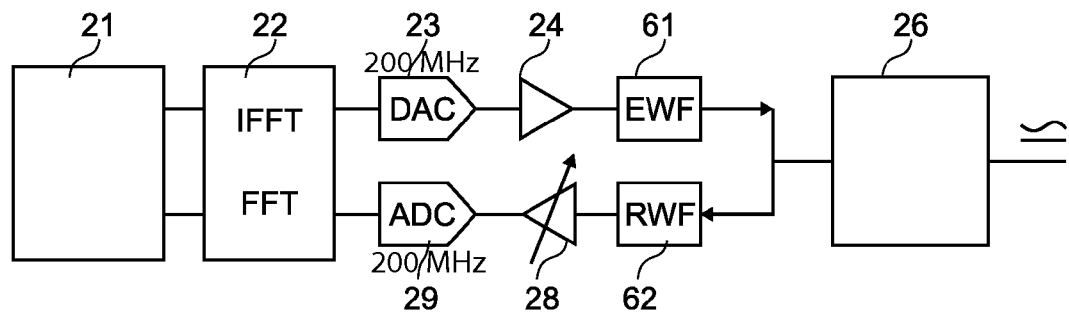
FIG. 6 illustrates the structure of an AFE system implementing the weighting filter of FIG. 4 in transmission and in reception.

As illustrated in FIG. 6, the invention proposes, in this example of an application, a novel AFE system having a structure identical to that of the classic AFE systems for transmission in the low-frequency band, described with reference to FIG. 2, except for the emission filter 25 and receive filter 27 which are replaced by analog weighting filters for transmission 61 and reception 62 according to the invention.

Figure 2:
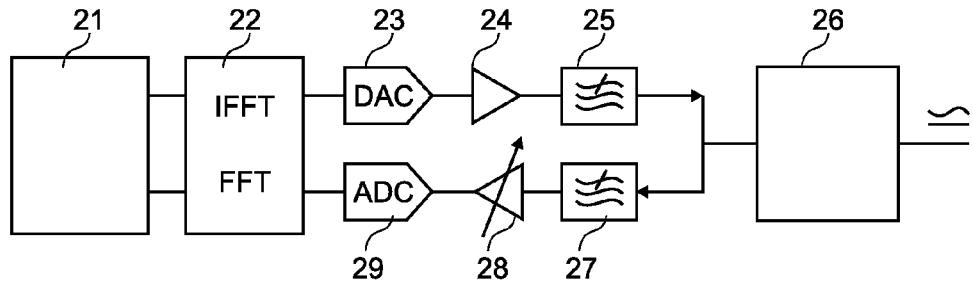

The physical layer digital processing module 21, frequency/time or time/frequency conversion module 22, digital/analog conversion module 23 or analog/digital conversion module 29, amplification module 24, controlled-gain amplifier 28 and module 26 for coupling with the mains network are similar to those presented with reference to FIG. 2 and are therefore not described in greater detail. It can be noted however, that the sampling frequency of the digital/analog or analog/digital conversion modules can be of the order of 200 MHz.

Figure 7:
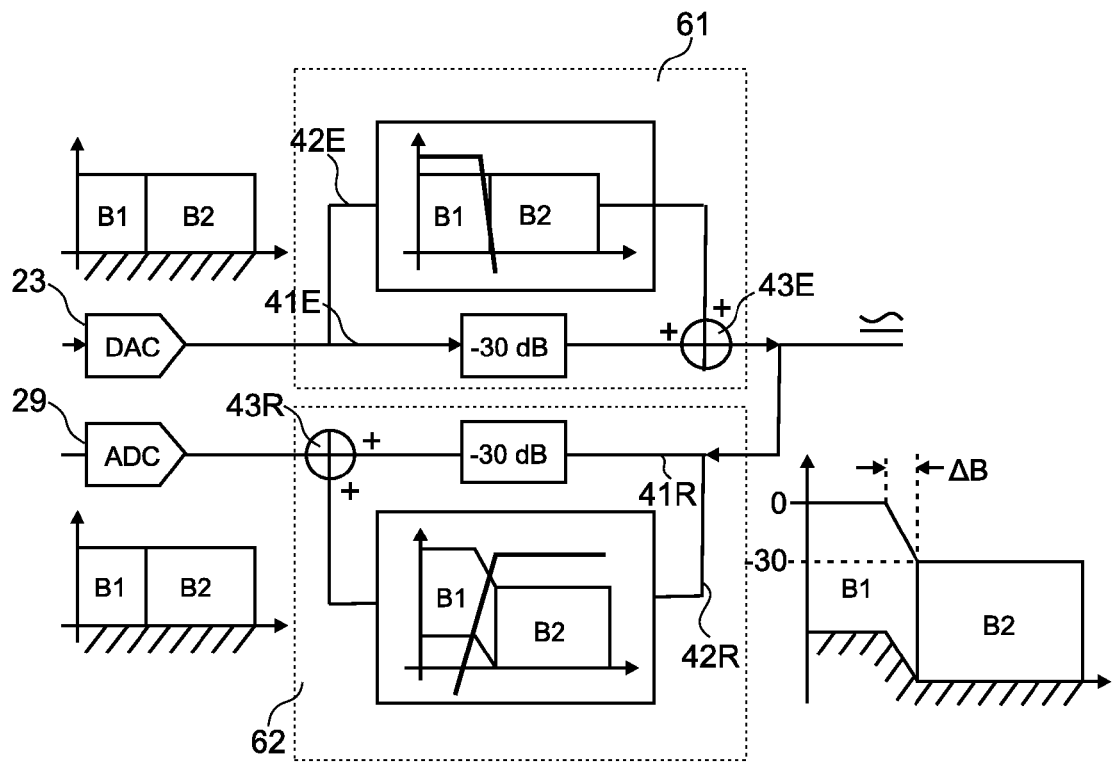
FIG. 7 represents the power levels of the different sub-bands at input and output of the weighting filters of the system of FIG. 6.

More specifically, as illustrated in FIG. 7, the weighting emission filter 61 receives, at output from the digital/analog conversion module 23, the two sub-bands B1 (about 0-30 MHz) and B2 (about 30-87.5 MHz) according to a uniform power distribution. This filter shapes the power profile of FIG. 1 (30 dB difference in power profile level between the sub-band B1 and the sub-band B2).

At reception, the weighting filter 62 performs the inverse operation and renders a uniform response before analog/digital conversion 29.

As described with reference to FIG. 4, the weighting emission filter 61 comprises two branches, the first branch 41E comprising a 30+6 dB resistance attenuator where the factor n is equal for example to 62, and a second branch 42E comprising a low-pass filter with a bandwidth B1, possibly having the same characteristics as the emission filter EF1 251 illustrated in FIG. 3. Such a low-pass filter consists of three filtering cells comprising two M cells and one "constant K" type cell and introduces a 6 dB loss in bandwidth. The sum 43E of the output of the low-pass filter with that of the attenuator makes it possible to approach the power profile dictated while at the same time preserving an identical signal-to-noise ratio for the two output sub-bands of the AFE as illustrated in FIG. 7. However, depending on the attenuation slope of the low-pass filter, it is necessary to consider a transition band ΔB of varying width in which the power level of the sub-band B1 is not optimal.

Figure 3:
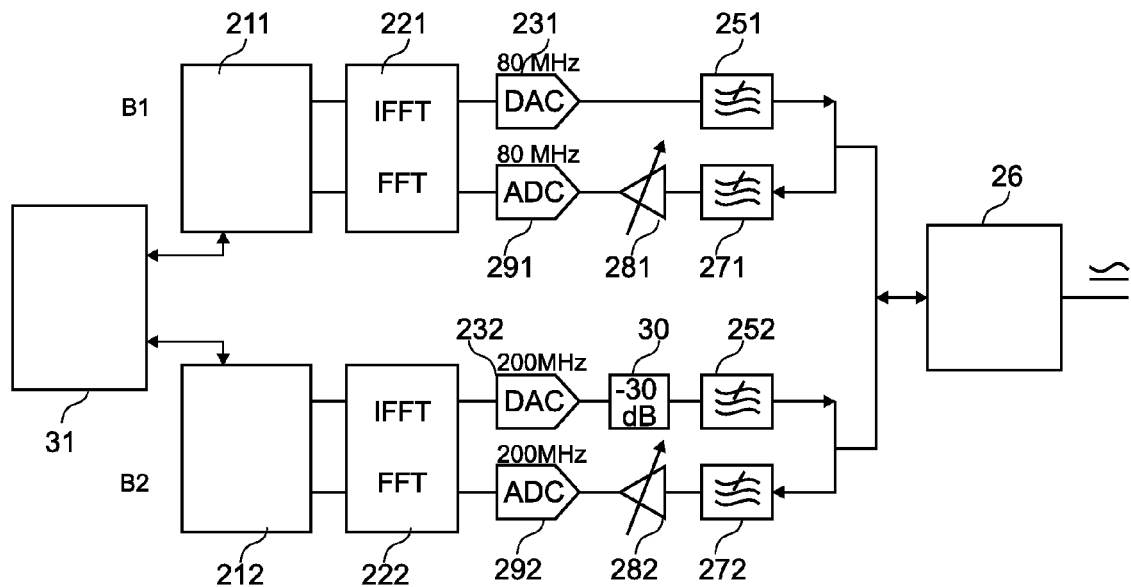

The weighting filter at reception 62 also comprises two branches, a first branch 41R comprising a 30+6 dB resistance attenuator and a second branch 42R comprising a high-pass filter with a bandwidth B2, possibly having the same characteristics as the receive filter RF2 272 illustrated in FIG. 3. Such a high-pass filter consists of three filtering cells comprising two M cells and one "constant K" type cell situated between them and introduces a 6 dB loss into the passband. The sum 43R of the output of the high-pass filter with that of the attenuator makes it possible to reconstitute a uniform signal before analog/digital conversion 29 and thus maintain an identical signal-to-noise ratio for the two sub-bands B1 and B2.

The 6 dB attenuation in addition to the 30 dB required by the power profile on the first branch in transmission and in reception corresponds to the 6 dB loss related to the introduction of the filtering means into the second branch which must be source impedance matched and load impedance matched by the resistors R as shown in FIG. 4.

It can also be noted that, for the system with two AFEs illustrated in FIG. 3, the efficiency of the transmission/reception system according to the invention depends on the selectivity of the emission/receive filters. Thus, the greater the attenuation slope of these filters, the more efficient is the system. To achieve these performances, it is desirable to use high-order analog filters which could be more complex to implant if we consider the classically used constant K cells.

This is why the inventors have proposed a novel weighting filter comprising specific filtering means implementing two M cells and one constant K cell. The use of the M cell makes it possible indeed to obtain a high attenuation slope and therefore a reduced transition band whereas the constant K cell makes it possible to attain high out-of-band attenuation relative to −36 dB.

Finally, the association of these three T cells leads to a phase rotation which, at the point of recombination of the two branches 41E and 42E (respectively 41R and 42R), is equal to $3\pi$. This recombination is thus advantageously done by a differential amplifier 43E (and 43R respectively) which is a non-inverter amplifier for the first branch and an inverter amplifier for the second branch and is classically used in analog signal-processing stages.

The transfer function of the weighting filter can therefore be expressed in the following form:

$$T_k = \frac{2Zb_k}{(R + Za_k + Zb_k)} \frac{Xb_k}{(Xb_k + Zd_k)} \frac{Zb_k}{(Ze_k + Zb_k)} \frac{R}{(Zf_k + R)} - 2Hp_k$$

with:

$$Za_k = \frac{mZ1_k}{2},$$

$$Zb_k = \frac{Z2_k}{m} + \frac{(1-m^2)}{4m}Z1_k,$$

$$Zc_k = \frac{1+m}{2}Z1_k,$$

$$Zd_k = \frac{(R+Za_k)Zb_k}{R+Za_k+Zb_k} + Zc_k$$

$$Ze_k = \frac{Zd_k Z2_k}{Zd_k + Z2_k} + Zc_k,$$

$$Zf_k = \frac{Ze_k Zb_k}{Ze_k + Zb_k} + Za_k,$$

$$Hp_k = \frac{1}{1+n},$$

R is the resistance used in the resistance attenuator, for example equal to 22.5 ohms in transmission and 24.5 ohms at reception;

Z1 is an inductive component and Z2 is a capacitive component for the weighting emission filter or inversely Z1 is a capacitive component and Z2 is a capacitive inductive component for the weighting receive filter;

n is a factor equal to 62, for example chosen to obtain a 36 dB attenuation;

m is a damping coefficient equal to 0.65 for example.

By way of examples, FIGS. 8A, 8B, 9A and 9B illustrate the transfer functions in amplitude and phase of the filtering means of the weighting filters in transmission and in reception.

Figure 8A:
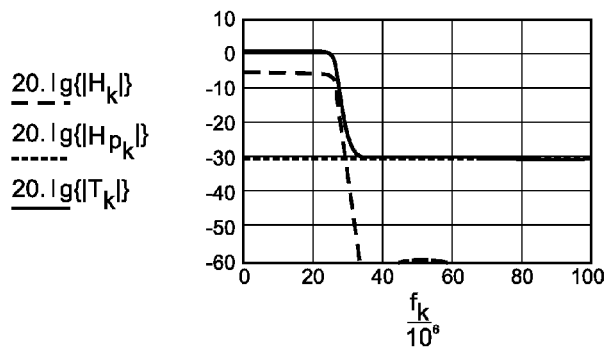
FIGS. 8A and 8B illustrate the transfer functions in amplitude and in phase of a weighting filter according to the invention, used when transmitting.
Figure 8B:
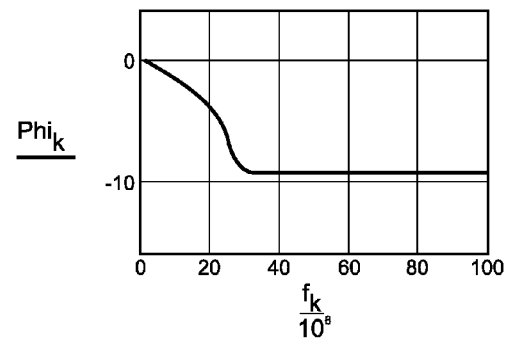

Thus, FIG. 8A illustrates the transfer function in amplitude and FIG. 8B the transfer function in phase to be obtained when transmitting, on a 0 to 100 MHz band with the following parameters, where Z1 is inductive and Z2 is capacitive:

$$Fc = 27 \cdot 10^6$$

$$R = 22.5$$

$$C = 3.9 \cdot 10^{-10}$$

$$L = 3.564 \cdot 10^{-7}$$

$$Z1_k = jL\omega_k$$

$$Z2_k = \frac{1}{jC\omega_k}$$

$$\Omega = 2\pi Fc$$

$$m = 0.65$$

$$n = 62$$

For the amplitude response of FIG. 8A, dashed lines show the responses of the two branches 41E and 42E and solid lines show the final response at output from the amplifier 43E. We therefore obtain the power profile sought with a reduced transition band $\Delta B$ of the order of 4 MHz and a phase response without discontinuity on all the sub-bands B1 and B2.

Figure 9A:
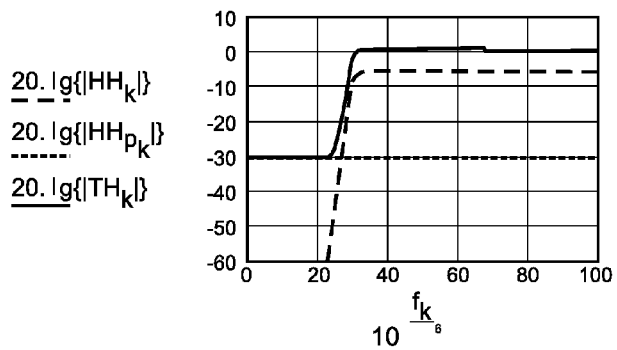
FIGS. 9A and 9B illustrate the transfer functions in amplitude and in phase of a weighting filter according to the invention, used in reception.
Figure 9B:
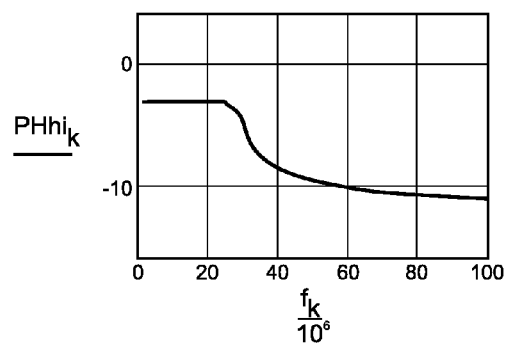

Similarly, FIG. 9A illustrates the transfer function in amplitude and FIG. 9B the transfer function in phase that can be obtained in reception, on a 0 to 100 MHz band with the following parameters where Z1 is, this time, capacitive and Z2 is inductive:

$$Fc = 28.9 \cdot 0^6$$

$$R = 24.5$$

$$C = 8.2 \cdot 10^{-11}$$

$$L = 9.246 \cdot 10^{-8}$$

$$Z1_k = \frac{1}{jC\omega_k}$$

$$Z2_k = jL\omega_k$$

$$\Omega = 2\pi Fc$$

$$m = 0.65$$

$$n = 62$$

For the amplitude response of FIG. 9A, dashed lines show the responses of the two branches 41R and 42R and a solid line shows the final response at output of the amplifier 43R. We therefore obtain an amplitude response complementary to that of transmission and the phase response remains also continuous on the total frequency range.

According to these examples of emission and reception weighting filters, the choice of the different parameters has been made so that the components, if they are not all integrated, can all be at least implanted with a very small space requirement (of the order of 1.6×0.8 mm$^2$ or 1.0×0.5 mm$^2$ for example), which is wholly compatible with the current hardware constraints.

An optimal functioning of the AFE system according to the invention is obtained by considering conditions of signal distortion that are negligible as compared with those of transmission channels.

Figure 10A:
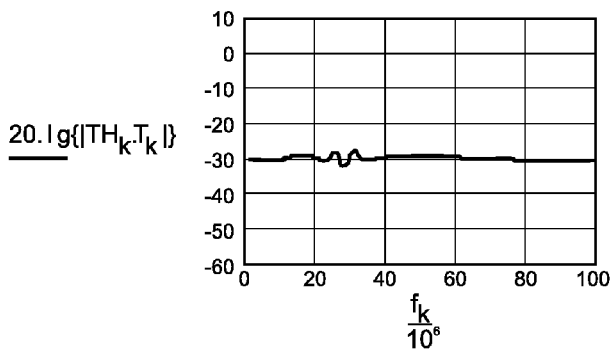
FIGS. 10A and 10B represent the overall result of the weighting filters in transmission and in reception.
Figure 10B:
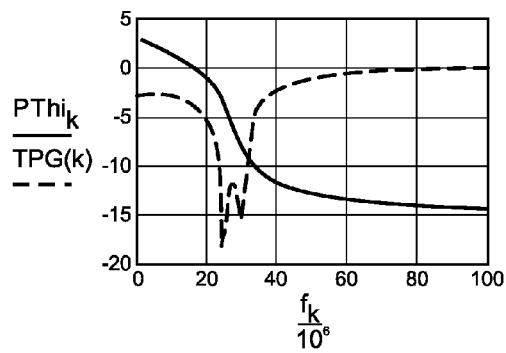

FIGS. 10A and 10B thus illustrate the characteristics of the overall filtering, in amplitude (10 dB per division) and in phase (5 radians per division), when the two emission and reception weighting filters are cascade-connected.

It is seen in FIG. 10A that the amplitude response is truly linear except for a slight over-oscillation on +/−2 dB localized in the transition band of the filtering means of the weighting filters. For an OFDM signal and given the deterioration of the channel, this distortion can be considered to be marginal.

Similarly, the phase response illustrated in FIG. 10B (in solid lines) remains gradual and continuous throughout the payload band, except in the transition band where we observe a slight break in the group propagation time (shown in dashed lines) of the order of 150 ns (50 ns/division) which remains insignificant for the transmission system concerned.

The weighting filters proposed in transmission and in reception, situated respectively after digital/analog conversion and before digital/analog conversion are therefore complementary.

6.3 Variants

In order to further improve this system, it is possible to carry out a pre-correction at transmission on certain OFDM signal carriers before IFFT, in digital mode. It is thus possible to substantially reduce the width of the transition band in locally accentuating the power level of the carriers situated at the cut-off frequency of the weighting filter in transmission and to do so without thereby significantly reducing the signal-to-digital/analog conversion noise ratio since the increase in power is done on a very narrow portion of the spectrum It is also possible to pre-correct the over-oscillation of amplitude of the total weighting response.

The invention claimed is:

1. A weighting filter intended for use in a device for transmitting and/or receiving an analog signal,
    said device being capable of at least one of transmitting or receiving said analog signal in a predetermined frequency band formed by two adjacent sub-bands called first and second sub-bands,
    wherein said weighting filter comprises:
    a first branch configured to attenuate the analog signal comprising the first and second sub-bands;
    a second branch configured to filter the analog signal comprising the first and second sub-bands, said second branch having a bandwidth corresponding to said first sub-band or else to said second sub-band; and
    means for combining signals coming from the first and second branches.

2. The weighting filter according to claim 1, wherein said first branch comprise a resistance attenuator.

3. The weighting filter according to claim 1, wherein said second branch comprises three filtering cells, two of which are "M" type cells, with a "constant K" type cell situated between them.

4. The weighting filter according to claim 1, wherein said means for combining comprise a differential amplifier.

5. A device configured for transmitting an analog signal in a predetermined frequency band formed by two adjacent sub-bands, called a first sub-band and a second sub-band, wherein the device comprises:
    one weighting filter, which comprises:
        a first branch configured to attenuate the analog signal comprising the first and second sub-bands;
        a second branch configured to filter the analog signal comprising the first and second sub-bands, said second branch having a bandwidth corresponding to said first sub-band or else to said second sub-band; and
        means for combining signals coming from the first and second branches.

6. The device according to claim 5, wherein the device further comprises:
    a module configured for digitally processing data to be transmitted, at a physical layer, delivering a digital signal;
    a module configured for frequency-time conversion of said digital signal;
    a module configured for digital-analog conversion of said digital signal in the time domain, delivering said analog signal;
    a module configured for amplifying said analog signal, delivering an amplified analog signal which is input to said weighting filter;
    a module configured for coupling the analog signal coming from the weighting filter with a mains network.

7. The device according to claim 5, wherein the second branch of said weighting filter comprises three filtering cells, two of which are "M" type cells, with a "constant K" type cell situated between them,
    said M cells each comprising three inductive components and one capacitive component, and said constant K cell comprising two inductive components and one capacitive component, each of the inductive components of said constant K cell being designed to be grouped together with an inductive component of one of said M cells.

8. A device configured for receiving an analog signal in a predetermined frequency band formed by two adjacent sub-bands, called a first sub-band and a second sub-band, wherein the device comprises:
    one weighting filter, which comprises:
        a first branch configured to attenuate the analog signal comprising the first and second sub-bands;
        a second branch configured to filter the analog signal comprising the first and second sub-bands, said second branch having a bandwidth corresponding to said first sub-band or else to said second sub-band; and
        means for combining signals coming from the first and second branches.

9. The device according to claim 8, wherein the second branch of said weighting filter comprises three filtering cells, two of which are "M" type cells, with a "constant K" type cell situated between them,
    said M type cells each comprising three capacitive components and one inductive component, and said constant K cell comprising two capacitive components and one inductive component,
    each of the capacitive components of said constant K cell being designed to be grouped together with a capacitive component of one of said M cells.

10. A method comprising:
    performing at least one of transmitting or receiving an analog signal in a predetermined frequency band formed by two adjacent sub-bands called first and second sub-bands, and
    weighted filtering said analog signal, implementing one weighting filter comprising:
        a first branch configured to attenuate the analog signal comprising the first and second sub-bands;
        a second branch configured to filter the analog signal comprising the first and second sub-bands, said second branch having a bandwidth corresponding to said first sub-band or else to said second sub-band; and means for combining signals coming from the first and second branches.

11. A non-transitory computer readable medium comprising computer program stored thereon and comprising instructions to implement a method of transmitting or receiving an analog signal in a predetermined frequency band formed by two adjacent sub-bands called first and second sub-bands, when said program is executed by a processor, wherein the method comprises:

weighted filtering said analog signal, implementing one weighting filter comprising:
 a first branch configured to attenuate the analog signal comprising the first and second sub-bands;
 a second branch configured to filter the analog signal comprising the first and second sub-bands, said second branch having a bandwidth corresponding to said first sub-band or else to said second sub-band; and wherein signals coming from the first and second branches are combined.

12. The device according to claim 8, wherein the device further comprises:
 a module configured for coupling to a mains network, receiving said analog signal which is input to said weighting filter;
 a controlled-gain amplification module configured for amplifying the analog signal coming from said weighting filter, delivering an amplified analog signal;
 a module configured for analog/digital conversion of said amplified analog signal, delivering a digital signal;
 a module configured for time-frequency conversion of said digital signal;
 a module configured for digitally processing said digital signal in the frequency domain, at the physical layer, enabling a rebuilding of data received.

* * * * *